(12) United States Patent
Bickel

(10) Patent No.: US 7,649,347 B2
(45) Date of Patent: Jan. 19, 2010

(54) METHOD AND APPARATUS TO EVALUATE NOTCHES IN AN ELECTRICAL POWER SYSTEM

(76) Inventor: Jon A. Bickel, 3123 Monarch Dr., Murfreesboro, TN (US) 37129

( * ) Notice: Subject to any disclaimer, the term of this patent is extended or adjusted under 35 U.S.C. 154(b) by 318 days.

(21) Appl. No.: 11/710,689

(22) Filed: Feb. 26, 2007

(65) Prior Publication Data

US 2008/0204954 A1 Aug. 28, 2008

(51) Int. Cl.
*G01R 13/04* (2006.01)
*G01R 21/06* (2006.01)
*G01R 19/00* (2006.01)

(52) U.S. Cl. .............................. 324/100; 702/60; 702/64

(58) Field of Classification Search ................. 324/100, 324/99 R, 98, 76.11, 606, 647, 656, 679, 324/705, 76.15, 500, 76.38, 522, 76.42, 618, 324/620; 702/57, 58, 60, 64, 71, 193
See application file for complete search history.

(56) References Cited

U.S. PATENT DOCUMENTS

| | | | | |
|---|---|---|---|---|
| 4,767,975 A | * | 8/1988 | Unsworth | 318/729 |
| 5,003,486 A | * | 3/1991 | Hendel et al. | 700/293 |
| 5,565,753 A | * | 10/1996 | Chen et al. | 318/809 |
| 6,360,177 B1 | * | 3/2002 | Curt et al. | 702/64 |
| 6,950,764 B2 | * | 9/2005 | Ennis et al. | 702/60 |
| 7,109,845 B2 | * | 9/2006 | Fischer | 340/10.1 |
| 2007/0211506 A1 | * | 9/2007 | Park | 363/125 |

OTHER PUBLICATIONS

"Power Xpert® 4000/6000/8000 Meters," Eaton Electrical Inc., Copyright © 2001-2007; http://www.eatonelectrical.com/NASApp/cs/ContentServer?GXHC_GX_jst=c7014444662d6165&G... 3 pages.

"Power Xpert® 4000/6000/8000 Power Quality Meters, Product Focus," Eaton Electrical Inc., Copyright © 2007, 8 pages.
"Next-Generation Power Quality Meters," Eaton Cutler-Hammer White Paper, Eaton Corporation, dated Jan. 2006, 12 pages.
"Power XPert® 4000/6000/8000 Power Quality Meters, Technical Data," Eaton Electrical Inc., Copyright © 2007, 12 pages.
"ION 7650 Intelligent Metering And Control Device," Power Measurement © 1992-2007, http://www.pwrm.com/products/ION7650/, 2 pages.
"ION 7650 Features Summary," Power Measurement © 1992-2007, http://www.pwrm.com/products/ION7650/features/, 2 pages.
"ION 7650 Applications Summary," Power Measurement © 1992-2007, http://www.pwrm.com/products/ION7650/applications/, 2 pages.
"Power Quality—Where did That Event Come From?" Power Logic Solutions, Square D, vol. 7, Issue 2, © 2003, Schneider Electric, 4 pages.
"POWERLOGIC © Circuit Monitor, Series 4000T Reference Manual, Instruction Bulletin" Schneider Electric, Square D Company, 40 pages.
"PowerLogic® ION7550/ION7650 Power Energy Meters," Schneider Electric, Square D. Company, Nov. 2006, 8 pages.
"Extensive Onboard Mass Memory Securely Records All Data," The Substation Automation Solution, 1 page.

(Continued)

*Primary Examiner*—Hoai-An D Nguyen

(57) ABSTRACT

A system and method to evaluate characteristics of notches in sine wave type electrical signals. An example method includes measuring a voltage waveform. A reference waveform is derived from the measured voltage waveform. A series of threshold voltage values is determined based on corresponding voltages of the reference waveform. The voltages of the voltage waveform are compared with the corresponding threshold voltages. The presence of a notch is indicated when a voltage of the voltage waveform is lesser in magnitude than the corresponding threshold voltage.

30 Claims, 8 Drawing Sheets

OTHER PUBLICATIONS

"Generic Specification For High Performance Power Monitoring, Revenue Metering, Power Quality Recording, And RTU Functionality," Nexus 1250, 10 pages.

"Performance Power Meter & Data Acquisition Node," Nexus 1250 for Industry and Utilities, Accu-Measure® Technology, Electro Industries/GaugeTech, dated May 25, 2005, 16 pages.

"EMTP-RV Computational Engine," ElectroMagnetic Transients Program/Software, 3 pages.

Bickel, Jon, Square D/Schneider Electric, "Identifying Problems From Transients In Power Systems," LaVergne, TN,—Plant Engineering, Sep. 1, 2004, 6 pages.

"Transient Power Systems (Part 1 in Transient Series)," PowerLogic Solutions, vol. 6, Issue 1, Square D/Schneider Electric, dated Sep. 2002, 4 pages.

"Transient Power Systems (Part 2 in Transient Series)," PowerLogic Solutions, vol. 6, Issue 2, Square D/Schneider Electric, dated Sep. 2002, 4 pages.

* cited by examiner

SAMPLED VOLTAGE SIGNAL

FUNDAMENTAL COMPONENT OR REFERENCE SIGNAL

PERCENT THRESHOLD

FIXED (BANDED) THRESHOLD

METHOD AND APPARATUS TO EVALUATE NOTCHES IN AN ELECTRICAL POWER SYSTEM

FIELD OF THE INVENTION

The present invention relates generally to electrical fault detection systems, and, in particular, to a notch detection system and method that automatically detects and evaluates notching in an electrical signal.

BACKGROUND OF THE INVENTION

Voltage notches are defined by IEEE 1195-1995 Standard, which states that a notch is "A switching (or other) disturbance of the normal power voltage waveform, lasting less than 0.5 cycles, which is initially of opposite polarity than the waveform and is thus subtracted from the normal waveform in terms of the peak value of the disturbance voltage. This includes complete loss of voltage for up to 0.5 cycles." This standard categorizes notching as a type of waveform distortion as it occurs periodically and "is principally characterized by the spectral content of deviation." As stated in IEEE 1195-1995, "the frequency components associated with notching can be quite high and may not be readily characterized with measurement equipment normally used for harmonic analysis." Notching is generally caused by electrical power devices when current is commutated from one phase to another such as by sudden switching. During this period, there is a momentary short circuit between phases which results in the voltage notch. Notches primarily apply to switched loads such as those from adjustable speed drives. For example, when there is a sudden demand for voltage by a silicon-controlled rectifier (SCR) in an adjustable speed drive and a rapid draw on the overall voltage demand will be seen which typically shows up as a notch in the output waveform.

Thus, a notch can represent a steady-state power characteristic, which may occur on a normal sine wave signal. A normal sine wave electrical signal typically experiences two zero-axis crossings per cycle (henceforth referred to as zero-crossings). In some cases, these zero-crossings are a reference point for the control schemes of some equipment. Thus, severe notching may result in equipment misoperation, malfunction, lockups, and even equipment damage. Excess zero-crossings and/or deep voltage notches that do not cross the zero-axis may result in malfunction or misoperation of some equipment ultimately leading to premature equipment failures. For example, if a clock for a device depends on zero-crossing for timing, excess zero-crossings can cause malfunctions in the device operation.

Thus, detection of voltage notching in input signals is necessary to protect equipment that depends on accurate zero-crossings. Further, detection of voltage notching may be needed to protect equipment from malfunctions or damage. Existing systems do not allow for the efficient detection of voltage notching or the evaluation of voltage notching, which is necessary to diagnose and address the notching source.

What is needed, therefore, is a system to allow users to determine the occurrence of a voltage notch in an electrical system. There is also a need for a system to quantify the characteristics (including severity) of a voltage notch in an electrical system. There is a further need for a system and method to evaluate voltage notches and provide mitigation solutions. Aspects of the present invention are directed at addressing these and other needs.

SUMMARY OF THE INVENTION

Briefly, according to one example, a method of detecting the occurrence of a notch event on any phase or phases, which lasts no longer than half of a cycle of an alternating-current waveform in an electrical system is disclosed. A voltage waveform is sampled to produce a sampled voltage waveform. A reference waveform is provided based on an ideal voltage waveform. A plurality of threshold voltages is determined based on corresponding voltages of the reference waveform. The voltages of the sampled voltage waveform are compared with the corresponding threshold voltages. The presence of a notch is indicated when a voltage of the sampled voltage waveform exceeds the corresponding threshold voltage. At least one characteristic of the notch is stored on a storage device as notch characteristic information.

Another example is a notch detection system to detect a notch event in an electrical system. The notch detection system includes a monitoring device to sample a voltage waveform to produce a sampled voltage waveform. A controller is coupled to the monitoring device and provides a reference waveform based on an ideal voltage waveform. The controller also determines a plurality of threshold voltages based on corresponding voltages of the reference waveform. The controller compares the voltages of the sampled voltage waveform with the corresponding threshold voltages and determines the presence of a notch when a voltage of the voltage waveform exceeds the corresponding threshold voltage. The controller stores at least one characteristic of the notch as notch characteristic information.

Another example disclosed is a power monitoring device for detecting a notch event that lasts no longer than half a cycle of an alternating-current waveform. The power monitoring device includes a sensor to detect a voltage waveform of the alternating-current waveform. A sampling circuit is coupled to the sensor to produce a sampled voltage waveform from the voltage waveform. A controller determines a reference waveform. The controller also determines a plurality of threshold voltages based on corresponding voltages of the sampled reference waveform and comparing the voltages of the sampled voltage waveform with the corresponding threshold voltages and indicates the presence of a notch when a voltage of the sampled voltage waveform exceeds the corresponding threshold voltage. The controller further determines at least one characteristic of the notch. The least one characteristic is either notch depth, phase angle at which the notch occurs, duration of the notch, or whether the notch event crosses the zero-axis. A display is provided for displaying information indicative of the at least one characteristic.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1:
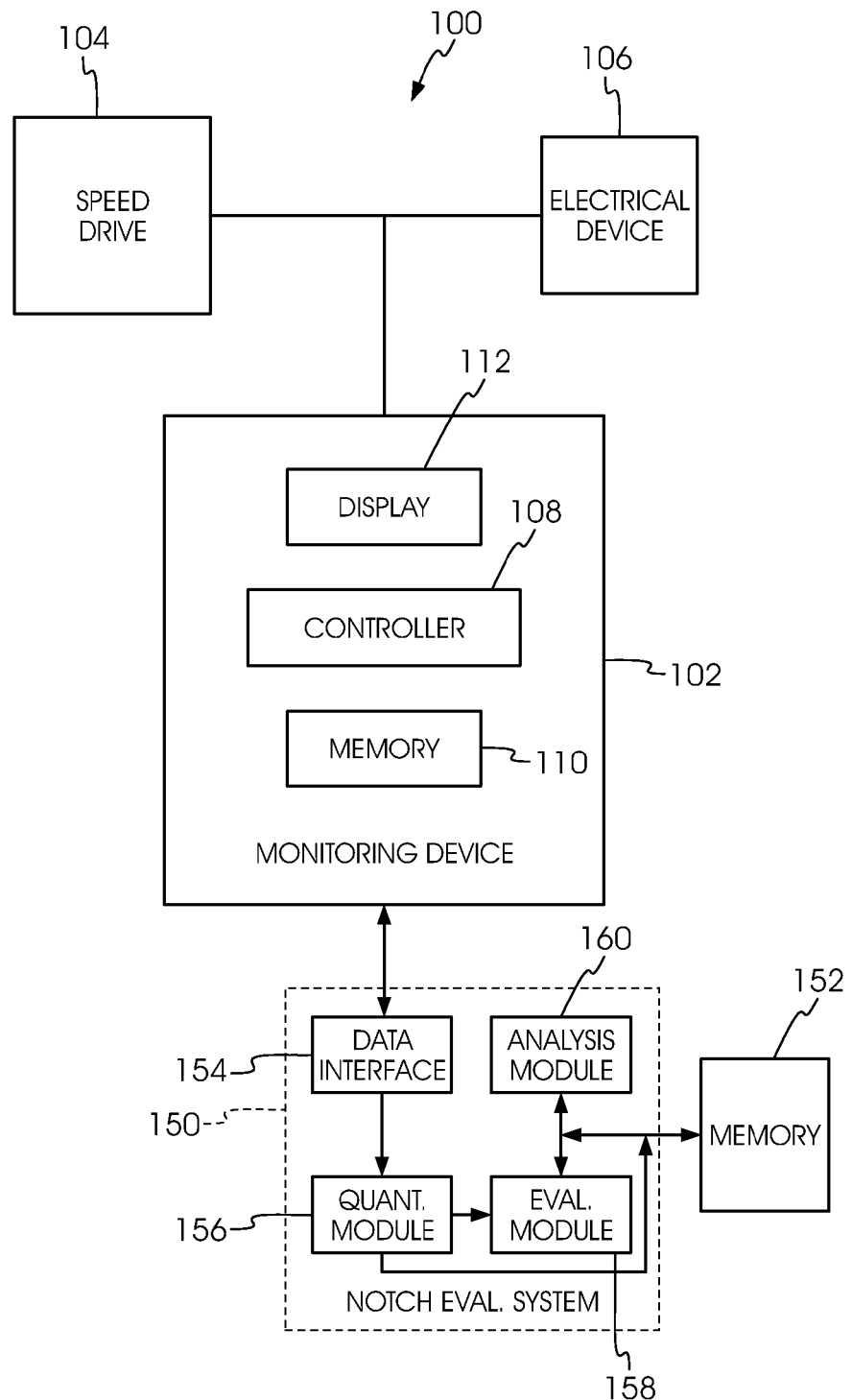
FIG. 1 is a block diagram of an electrical system including the notch detection and evaluation system according to an aspect of the present invention.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION Of The ILLUSTRATED EMBODIMENTS

FIG. 1 is a block diagram of an electrical power system 100 according to an aspect of the present invention. Monitoring devices within the electrical power system 100 may be arranged in a hierarchical relationship defining the organization of electrical power system (whether utility-side or demand-side of the point-of-common coupling (PCC)). The electrical power system 100 includes a monitoring device 102, which is located in proximity to the output of an example adjustable speed drive 104 in the electrical power system 100. The monitoring device 102 may represent any electrical system element or apparatus with the ability to sample, collect, measure, and/or store the operational characteristics and parameters of the electrical power system 100 to which it is connected. In this example, the monitoring device 102 can be based on a PowerLogic® Series 3000/4000 Circuit Monitor or a PowerLogic® ION7550/7650 Power and Energy Meter available from Schneider Electric, or any other suitable monitoring device such as a circuit breaker, a metering device, or a power meter. It is to be also understood, that the adjustable speed drive 104 is an example and other drives or electrical devices may be monitored in accordance with the implementations described below. There may also be multiple monitoring devices with the capabilities of the monitoring device 102 in the system 100. For the sake of simplicity, only one monitoring device 102 is shown, though it is understood that typically multiple monitoring devices 102 are present to form a hierarchy defining how the monitoring, devices are linked together in the electrical power system 100.

The adjustable speed drive 104 in this example includes a power source and an associated switching circuit that may include thyristors or SCRs to provide variable drive outputs. The adjustable speed drive 104 powers an electrical device 106. The monitoring device 102 includes a controller 108 with firmware stored on a memory device 110 for automatic detection of notches on the output voltage waveform of the adjustable speed drive 104 according to aspects of the present invention. The monitoring device 102 also optionally includes a display 112, which may be used to display warnings of the occurrence of a notch or notches, notch related data, or other useful information. The memory device 110 may be used to store notch waveform shapes and data derived from detected notches. The display 112 may be incorporated in the monitoring device 102 or may be connected to the monitoring device 102 by way of a remote cable, for example.

The monitoring device 102 includes a conventional data interface that is coupled via a communication link to an example notch analysis system 150. The communication link can be wired or wireless or a combination thereof. The notch analysis system 150 may, for example, be implemented by a logic circuit in communication with or integral to the electrical system 100, or may be implemented by software and/or firmware executed by a CPU or controller (not shown). The example notch analysis system 150 is coupled to a memory device 152 that stores the data collected from the monitoring device 102 and/or other data analyzed by the notch analysis system 150. The memory device 152 is preferably a high-capacity storage device. The notch analysis system 150 includes a data interface 154 that is coupled to the monitoring device 102. The data may be collected from external sources such as the monitoring device 102 by the data interface 154 via the communication link. The notch analysis system 150 also includes a quantification module 156, a notch evaluation module 158, and a mitigation analysis module 160. Alternatively, some or all of the functions, procedures, processes, or methods of the notch analysis system 150 may be performed by the monitoring device 102. Of course, it is to be understood that the notch analysis system 150 may be coupled to multiple monitoring devices similar to or different from the monitoring device 102.

Figure 2A:
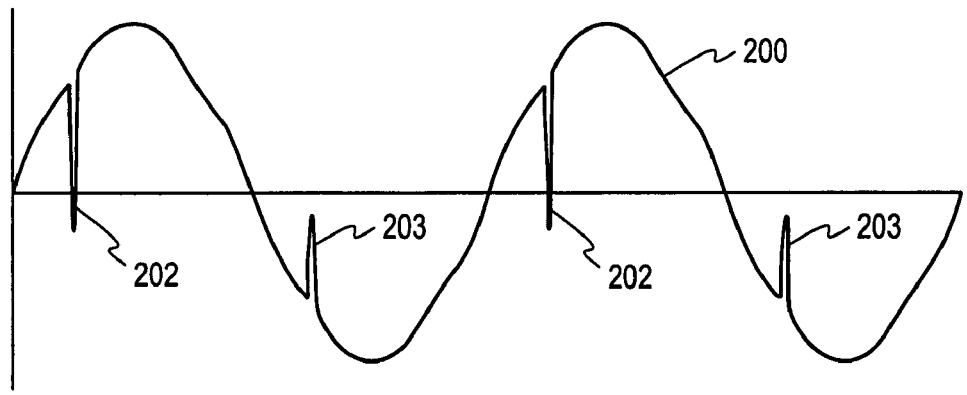
FIGS. 2A and 2B are waveform traces of exemplary sampled voltage waveform and reference signals used to determine the occurrence of notching.

FIG. 2A illustrates an example voltage trace of a sampled voltage signal waveform 200 representing the voltage at the input of the adjustable speed drive 104 in FIG. 1 by the monitoring device 102 where the x-axis represents time and the y-axis represents voltage. The sampled voltage signal waveform 200 is generated by continual sampling of the electrical system 100 by the monitoring device 102. Samples may be taken at a sufficient resolution to detect notches and obtain data from the detected notches such as 64 samples per cycle. The sampled voltage signal waveform 200 includes waveform distortions that have harmonic components and undesirable notching represented by a series of notches 202, 203. The notches 202 cross the zero-axis while the notches 203 do not. Both are considered notches in accordance with aspects of the present invention. In this example, the controller 108 of the monitoring device 102 performs spectral calculations or software/hardware filtering on the sampled voltage signal waveform 200 to determine the instantaneous values of the reference voltage of the voltage signal in FIG. 2A. The reference voltage may correspond to the fundamental frequency voltage, a nominal system voltage, or some other arbitrary voltage. The fundamental frequency is determined by the system frequency value in the monitoring device 102 (e.g., 50 Hertz, 60 Hertz, or 400 Hertz). Alternatively, the spectral calculations or filtering may be performed externally in the notch analysis system 150 or by some other external device. The result of the spectral calculation or filtering is the discrete frequency component(s) used to determine the value of the reference voltage (which is the same as the fundamental frequency voltage). The reference voltage may also be generated based on an ideal nominal system voltage or some other arbitrary ideal voltage.

Figure 2B:
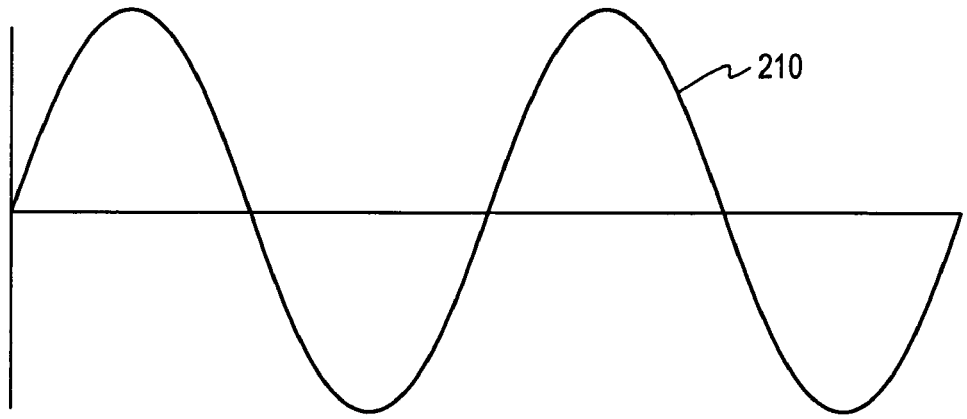

FIG. 2B illustrates a reference voltage signal 210 of the sampled voltage signal waveform 200 from FIG. 2A. The reference voltage signal 210 represents a baseline signal to determine whether a notch occurs on the sampled voltage signal waveform 200 in FIG. 2A. User-configurable threshold voltages may be used to determine the existence of notch events on the sampled voltage signal. A notch event occurs when the voltage signal deviates from the configured threshold value. Two types of user-configurable thresholds may be set to detect a notch: 1) a percentage-based threshold; and 2) a fixed-voltage threshold. The percentage-based threshold method allows the user to configure the notch detection feature without being concerned with the steady-state input voltage to the monitoring device 102. For example, if the line voltage is 480 $V_{rms}$, a 10% threshold would set the alarm threshold at 432 $V_{rms}$. Likewise, if the line voltage is 208 $V_{rms}$, a 10% threshold would set the alarm threshold at 187.2 $V_{rms}$, providing simple configuration of the threshold. The fixed-threshold method gives a user more control over where to set the threshold values.

According to an implementation of the present invention, the thresholds are based upon the absolute value of the sampled voltage such that the values are always non-negative. The absolute value of the percentage-based threshold attenuates as the sine wave approaches the zero-crossing while the fixed voltage threshold remains constant. Thus, an absolute value may be set for a fixed-voltage threshold value for the monitoring device 102. Unlike the notches detected with the percentage-based threshold, all detected notches based on the fixed-voltage threshold value (1) have at least the depth of the fixed voltage threshold value or (2) cross the zero-axis. In other implementations, the thresholds need not be based upon the absolute value of the sampled voltage.

In this example, the monitoring device 102 continuously or periodically compares the threshold values with the corresponding instantaneous voltage of the sampled voltage waveform signal to determine whether the magnitude of the sampled voltage signal value is less than the magnitude of the threshold value, indicating the presence of a notch.

Figure 3A:
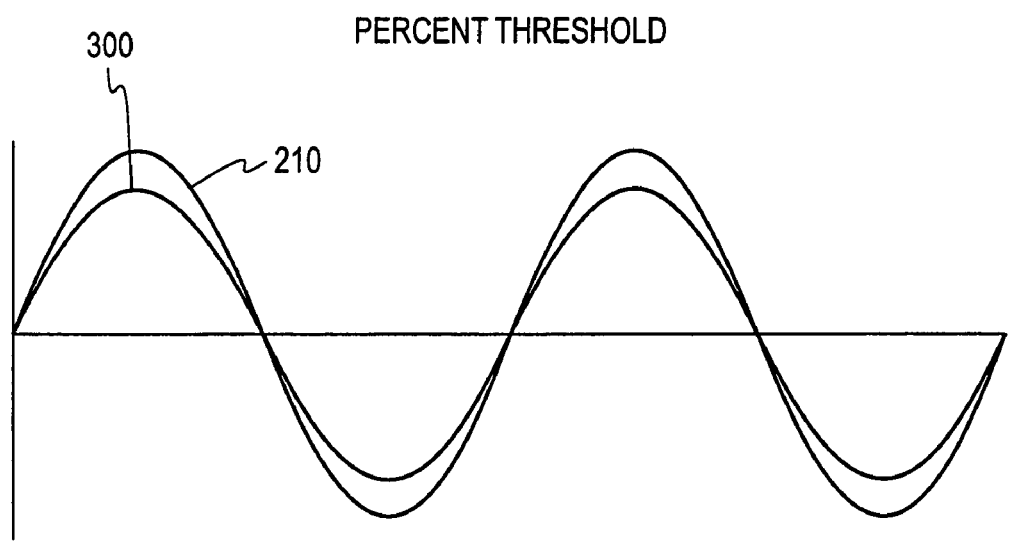
FIGS. 3A and 3B are voltage traces of exemplary threshold voltages determined by different methods.

FIG. 3A is a voltage trace 300 of the threshold voltages corresponding to percentage-based threshold values for detecting notching. The percentage-based threshold voltage trace 300 is configured based on a percentage of the instantaneous value of the reference voltage signal 210 of FIG. 2B interposed on the voltage trace 300 in FIG. 3A. Each sampled point of the voltage waveform 200 in FIG. 2A is compared to that percentage (threshold voltage) of the corresponding voltage on the reference voltage signal 210. The threshold voltages at each sample are shown diagrammatically in FIG. 3A for ease of understanding. However, it should be understood that in some implementations the monitoring device 102 merely calculates the threshold voltage at each voltage sample. If a voltage on the sampled voltage signal 200 has a lesser magnitude than the corresponding threshold value, such as by passing below the percentage-based threshold value when the signal has a positive polarity or above the percentage based threshold value when the sampled voltage signal waveform 200 has a negative polarity, a notch is detected. FIG. 3A shows both the reference voltage signal 210 and the percentage threshold trace 300 of the percentage-based threshold values for the reference voltage signal 210 based on a threshold setting of 90%. This threshold setting is exemplary only and of course other thresholds are contemplated by aspects of the present invention. Thus, the threshold voltages are 90% of the instantaneous value of the corresponding voltages of the reference voltage signal 210. In this method of voltage notch detection, all deviations of the reference voltage signal 200 across the zero-axis are inherently considered voltage notches. For example, in FIG. 2A, the first and third voltage notch 202 deviate across the zero-axis. Other notches are considered detected when the voltage is less than the percentage-based threshold value.

Figure 3B:
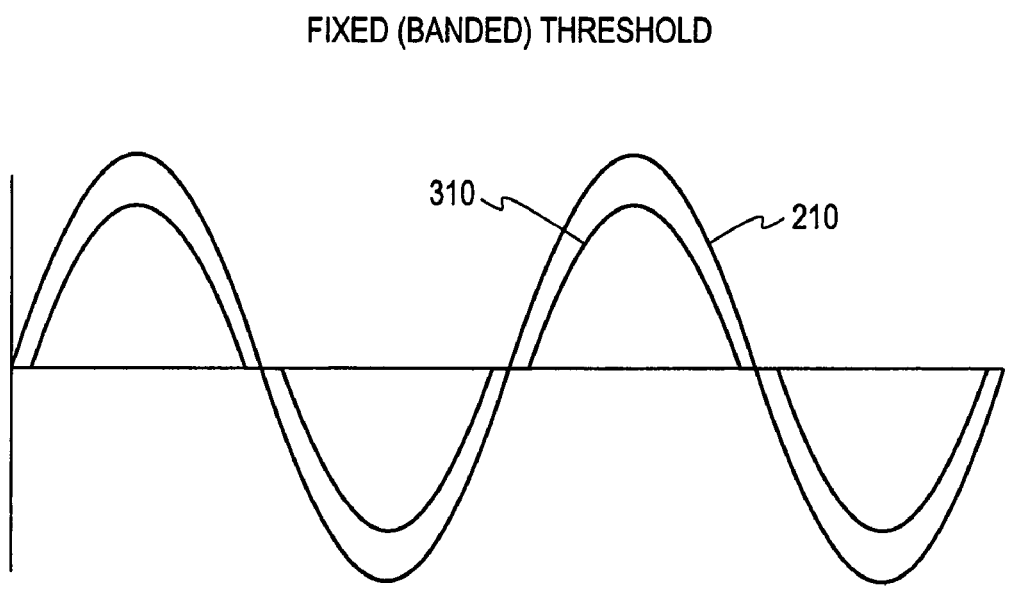

FIG. 3B illustrates a comparison between the reference voltage signal 210 and a fixed threshold voltage curve 310. The fixed-threshold voltage values of the fixed threshold voltage curve 310 represent thresholds for notch detection. The fixed threshold voltage curve 310 is configured based on a positive real number value in volts. A voltage value is selected for the fixed threshold and is subtracted from the reference voltage signal 210 in FIG. 3B to determine the limit where a notch may be detected. The fixed threshold voltage curve 310 is zeroed out when the voltage values on the curve 310 approach zero. Each sample of the sampled voltage signal waveform is compared to the corresponding voltage of the fixed threshold voltage curve. If a voltage on the sampled voltage signal waveform 200 has a lesser magnitude than the corresponding threshold value such as passing below the fixed threshold value when the signal has a positive polarity or above the fixed threshold value when the sampled voltage signal waveform 200 has a negative polarity, a notch is detected. In this example, FIG. 3B shows both the reference voltage signal 210 and the fixed threshold values curve 310 for the reference signal based on a setting of 40 volts. In this implementation of voltage notch detection, any deviation of the sampled voltage signal across the zero-axis is considered a voltage notch, regardless of the fixed threshold.

Once a voltage notch is detected in the sampled voltage signal waveform, the power monitoring device 102 may notify the end user that a notch has occurred via a notch alarm and/or a visual indication on the display 112, which will be explained below. Characteristic information associated with the notch can also be stored in memory for further analysis as discussed herein. In examples where notches occur frequently, such as in connection with an adjustable speed drive, the notch alarm may be set to be triggered if an excessive number of notches occurs over a period of time or under other conditions designated by a user.

Figure 4A:
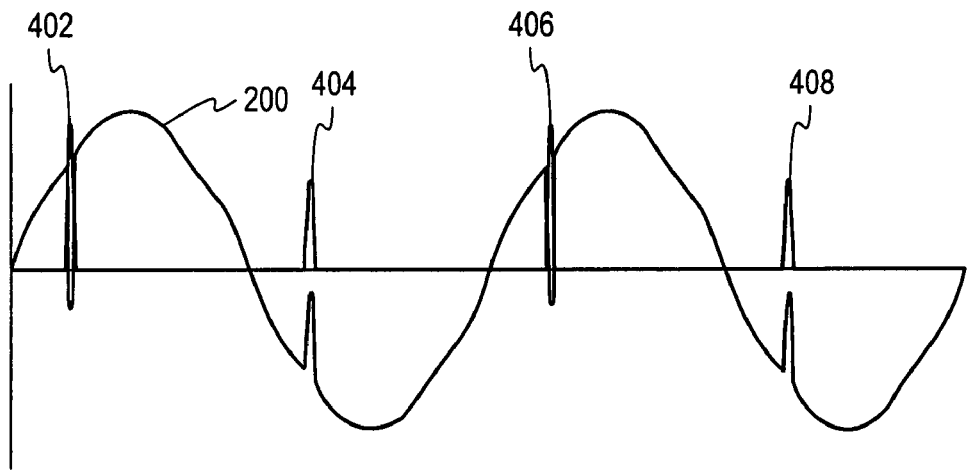
FIGS. 4A and 4B are voltage graphs of exemplary resulting notch data signals for evaluation of the notches using the threshold voltages determined in FIGS. 3A and 3B respectively.
Figure 4B:
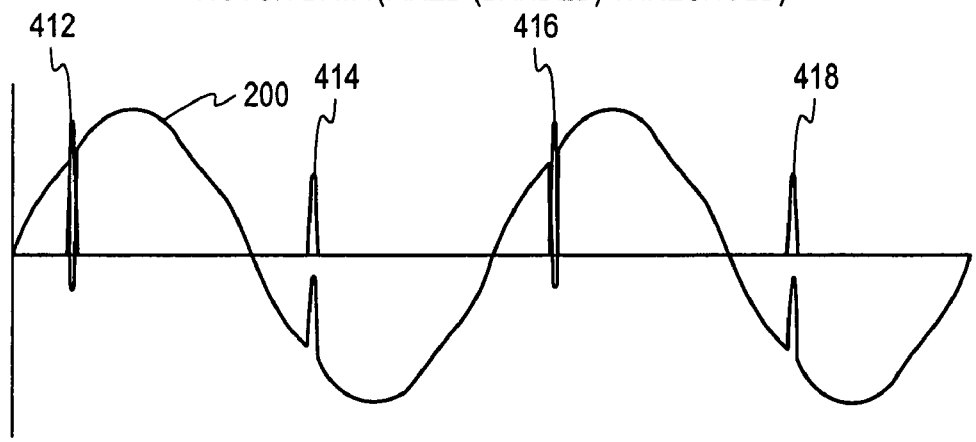

The voltage notches may be quantified and evaluated by the monitoring device 102 alone or in combination with the notch analysis system 150. The monitoring device 102 and the notch analysis system 150 may quantify and/or evaluate the detected voltage notches according to different implementations. For example, measuring the severity of detected notches is important in determining their effect on system equipment and components. The algorithm for this feature may provide data similar to that shown in FIGS. 4A-4B. FIG. 4A is a voltage graph of the voltage notching data for the voltage signal waveform 200 in FIG. 2A, where notches are detected by comparing the notching data against percentage based threshold values such as those shown in FIG. 3A. FIG. 4B is a voltage graph of the voltage notching data for the sampled voltage waveform signal 200 in FIG. 2A, where notches are detected by comparing the notching data against fixed voltage threshold values such as those shown in FIG. 3B. In FIG. 4A, the notch signals are isolated by calculating the absolute value of the difference between the instantaneous voltage from the sampled voltage waveform signal 200 and the reference voltage signal 210 in FIG. 2B, which produces isolated notch signal shapes 402, 404, 406 and 408. Because the absolute value is taken, negative voltage notches such as the notch signal shapes 402 and 406 are shown as positive voltage values. The severity of the detected notches may then be determined by comparing the notch signal shape voltage to the corresponding reference voltage. Alternatively, severity may be measured as an absolute voltage value or $V_{rms}$ value difference from the corresponding reference voltage. As explained above, the severity or depth of the detected notch may be displayed either quantitatively or qualitatively (e.g., via colors) on the display 112 of the monitoring device 102 in FIG. 1. As discussed above, although the examples shown in FIGS. 4A and 4B calculate the absolute values of the notch shapes, in other aspects, the absolute values need not be taken, preserving the polarity information of the notch.

Correspondingly, in FIG. 4B, the notch signals are isolated by determining the absolute value of the difference between the instantaneous voltage from the voltage waveform signal 200 and the corresponding voltage from the reference voltage signal 210 in FIG. 2B, which produces isolated notch signal shapes 412, 414, 416 and 418. Because the absolute value is taken, negative voltage notches such as the notch signal shapes 412 and 416 are shown as positive voltage values. As explained above, the severity of the detected notches may then be determined by comparing the notch signal voltage to the corresponding reference signal's level. As explained above, the severity or depth of the detected notch may be displayed on the display 112 of the monitoring device 102 in FIG. 1.

The information from the voltage graphs such as in FIGS. 4A and 4B is analyzed to provide voltage notch characteristic information such as depth (expressed in volts, per unit, $V_{rms}$, or percentage), phase angle (expressed in degrees or radians), duration (expressed in time units such as milliseconds or microseconds or a percentage of the cycle) and whether the notch is zero-crossing. The notch characteristic information in this example is determined by the controller 108 on the monitoring device 102 and communicated to the quantification module 156 in the notch analysis system 150. The notch characteristic information is stored in the memory device 110 of the monitoring device 102. Of course, the waveform data may be sent to the notch analysis system 150 and the notch characteristic information may be determined by the quantification module 156. For example, based on the notch shapes in FIG. 4A and assuming a peak voltage of 678 volts, the notch signal 402 has a depth of 355 volts, a phase angle of 45 degrees, a duration of 500 microseconds and crosses the zero-axis. In contrast, the example notch signal 404 has a depth of 250 volts, a phase angle of 255 degrees, a duration of 750 microseconds and does not cross the zero-axis.

The notch characteristic information such as depth, phase angle, duration and zero-crossing derived from FIGS. 4A-4B may be expressed in many different ways. The depth of a notch expressed in a voltage, per unit, or a percentage of the degree of variance along the y-axis from the nominal value. Notch depth is important for obvious reasons. In general, loads are designed to operate optimally with smooth waveforms (i.e., a pure sine wave). A notch in the voltage signal supplied to a load can affect the load in any number of ways including misoperation, damage, timing issues, inoperability, etc. A notch's depth directly influences the extent to which the notch can impact a load. The deeper the notch, the more potential impact to the load.

Knowledge of the phase angle when a notch occurs is extremely important in troubleshooting notching problems. Multiple power electronics devices can cause multiple notches in the waveform. As the firing angle of different power electronics devices moves closer to each other, the possibility of multiple power electronics devices cross-firing (two power electronics components turning on at the same time) increases. Cross-firing generally increases the depth and width of a notch, and can also increase the possibility of an additional zero-crossing. Knowledge of the phase angle can assist in coordinating the operation of such devices to prevent cross-firing.

Theoretically, the duration of a notch is the degree of variance along the x-axis from the nominal value. Practically, the duration of a notch is the degree of variance from the threshold along the x-axis. Like notch depth, the duration of a notch can adversely affect the optimal operation of a load. The longer the duration of a notch, the more impact to the load.

Many loads use timing circuits that rely on an expected number of zero-crossings of the power signal—two zero-crossings per cycle (at 0° and 180°). Additional zero-crossings can "confuse" the timing circuit, resulting in misoperation of a load exposed to the superfluous zero-crossing(s).

The notches may be evaluated based on the characteristic information obtained for each notch. The user may configure the controller 108 of the power monitoring device 102 in FIG. 1 to trigger an alarm based on different notch conditions. For example, an alarm may be triggered on any integer multiple number of voltage notching events or on any integer multiple number of unexpected zero-axis crossing within a certain time period. The alarm may be an audio alarm or it may be a visible indication on the display 112. In still other aspects, the alarm may be transmitted electronically via email, a pager, a cellular telephone, and the like. For example, a qualitative indicator may be used to indicate the detection and severity of a single notch or the occurrence of any integer multiple number of voltage notching events within a certain time period. Qualitative indicators may include a color code (i.e., green, yellow, red, etc.), different audio tones, a tabular graph, or text (i.e., severe, moderate, slight, etc.) representing information such as notch severity, different ranges of frequencies of notch occurrences, notch duration, etc. Alternatively, a quantitative indicator such as a histogram or a time plot may be displayed on the display 112. The occurrence of the voltage notch and other data detailed below may be stored on the memory device 110 of the monitoring device 102 and/or communicated to the notch analysis system 150 in FIG. 1.

Other useful voltage notching evaluation information may be derived from the voltage notch characteristic information for successive notches. Such data may be transmitted to the notch analysis system 150 and stored in the memory device 152 for further evaluation. For example, voltage notch characteristic information may be used by the evaluation module 158 to determine factors such as: number of voltage notches per second, maximum notch voltage measured, average notch voltage measured, maximum depth of a voltage notch over period of time, etc. Further, the corresponding phase angle of a detected notch may be correlated with corresponding notch width, corresponding area outside the threshold and maximum voltage notch width. The corresponding phase angle may also be correlated with corresponding notch depth, corresponding area outside the threshold and statistical data per phase. The interval data on extra zero-crossings may be measured in different time units such as by the second, minute, hour, day, week, month or year. Correspondingly, the interval data on notch area (volt-seconds) per phase may be measured in different time units such as by the second, minute, hour, day, week, month or year.

The notch evaluation module 158 may perform trending and forecasting of interval data via techniques such as linear regression of data, average numbers of notches per interval, expected number per interval, trend lines, etc. The evaluation module 158 may be programmed to provide data to the notch mitigation analysis module 160 in order to troubleshoot excessive voltage notching and determine equipment likely causing the voltage notching and make recommendations to mitigate the voltage notching problem. Correlations of the notching data per phase over time can also be performed to determine whether there is a single source of the notching or multiple sources.

Figure 5:
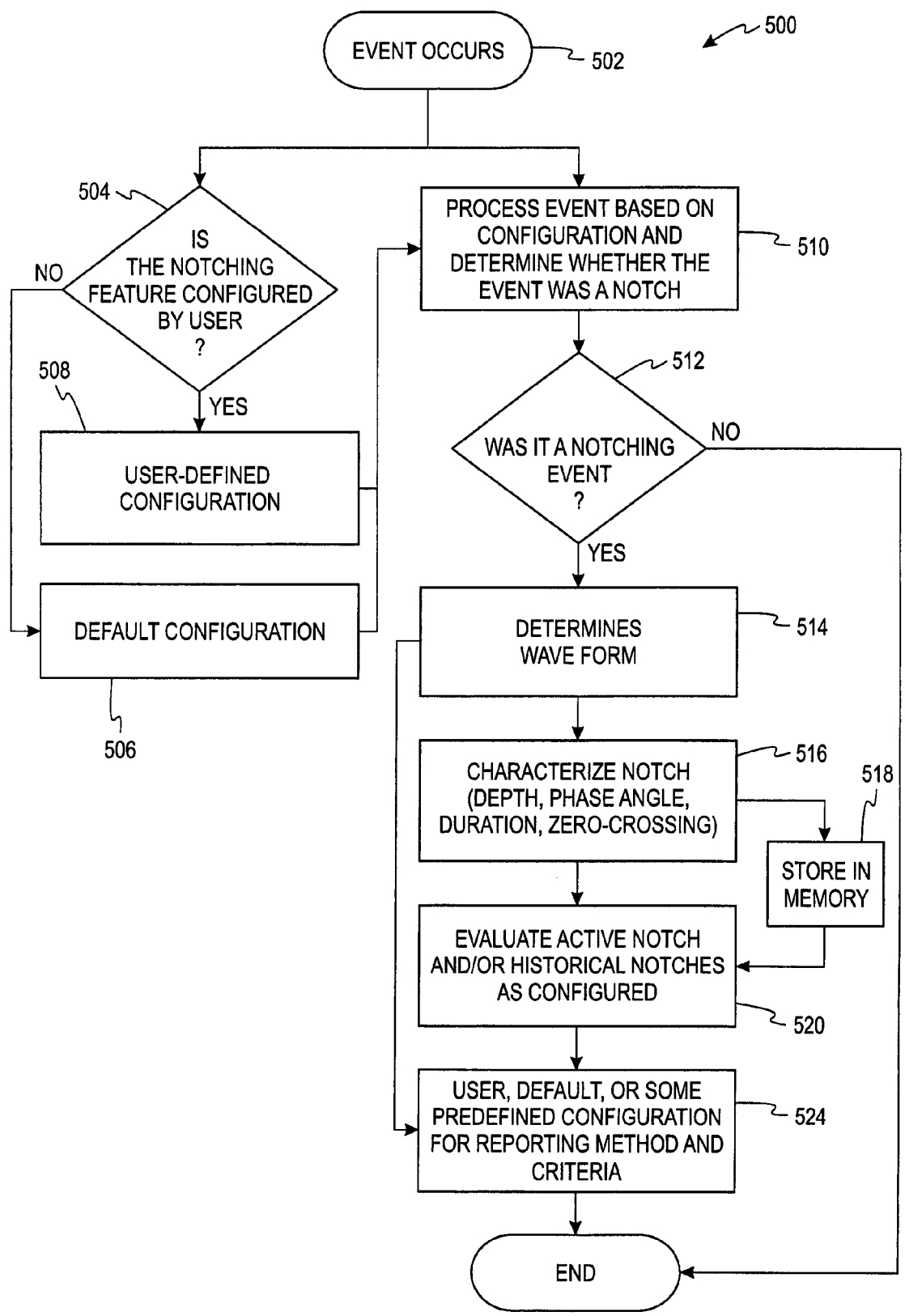
FIG. 5 is a flow diagram of a process to detect, evaluate and categorize a notch event.

FIG. 5 is a flow chart 500 representative of example machine readable instructions for implementing the process of notch detection and evaluation on the monitoring device 102 and the notch analysis system 150 of FIG. 1. In this example, the machine readable instructions comprise an algorithm for execution by: (a) a processor, (b) a controller, and/or (c) any other suitable processing device. The algorithms in FIGS. 5-8 may be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a processor and/or embodied in firmware or dedicated hardware in a well known manner (e.g., it maybe implemented by an application specific integrated circuit (ASIC), a programmable logic device (PLD), a field programmable logic device (FPLD), discrete logic, etc.). For example, any or all of the controller 108, the quantification module 156, the notch evaluation module 158 and the mitigation analysis module 160 could be implemented by software, hardware, and/or firmware. Also, some or all of the machine readable instructions represented by the flowcharts of FIGS. 5-8 may be implemented manually. Further, although the example algorithm is described with reference to the flowcharts illustrated in FIGS. 5-8, persons of ordinary skill in the art will readily appreciate that many other methods of implementing the example machine readable instructions may alternatively be used. For example, the order of execution of the blocks may be changed, and/or some of the blocks described may be changed, eliminated, or combined.

When any electrical event occurs (502), the monitoring device 102 determines whether the notch detection feature has been configured by the user (504). The configuration includes selecting a threshold type and designating percentage or voltage levels for the threshold values. The configuration may further or alternatively include output settings and alarm levels. An output setting may be an email account, a pager number, or a video display. An alarm level may be set for notch durations, number of zero-crossings, and the like. If the notch detection feature for the monitoring device 102 has not been configured, the controller 108 loads a default configuration, which may be set at the time the monitoring device 102 is manufactured (506). If a user has configured the notch detection feature, the controller 108 loads the user-defined configuration from the memory device 110 (508). The monitoring device 102 processes the electrical event based on the configuration of the threshold reference from either the user configuration or the default configuration (510). In this example, the threshold reference may be either a predetermined percentage of the reference waveform or a fixed voltage from the reference waveform as explained above. After processing the electrical event, the monitoring device 102 determines whether the event was a notch (based on the comparison of the threshold signal with the actual signal and/or the presence of a zero-crossing) (512). If the electrical event was not a notch, the monitoring device 102 ends the algorithm and nothing happens. If the electrical event was a notch, the monitoring device 102 determines the absolute voltage value waveform of the notch as shown in FIG. 4A or 4B (514). Based on the notch waveform, the monitoring device 102 determines characterization information regarding the notch (516) such as the depth, the phase angle, the duration and whether the notch is a zero-crossing. The notch characteristic information is stored in the memory device 110 in the monitoring device 102 for later analysis (518). The notch characteristic information may also either be sent to the notch analysis system 150 for storage in the memory device 152 or further analysis may be performed by the monitoring device 102. Once the notch characteristic information is determined, the notch analysis system 150 may perform several operations concurrently as represented by (520).

The notch characteristic information is evaluated by the monitoring device 102 or the notch analysis system 150 to determine characteristics and other data relating to the detected notch or notches (520). The evaluation may use historical data regarding other notches detected to classify the notch or determine the notch source. The results of the evaluation for a detected notch are also stored in the memory device 110 or the memory device 152 for use with further evaluations of subsequent notches. The occurrence of the notch is also reported to the user of the monitoring device 102 and/or the notch analysis system 150 for later subsequent action in reporting, analysis, and/or as a reference as needed (522).

The notch characteristic information may be stored to compile a library of known notch occurrences (either the user's custom configuration or an auto configuration) in the memory devices 110 or 152. The data collected and analyzed is stored for further assessments based on the notch characteristic information. The user is allowed to enable or disable all or any subset of data gathered and analyzed by the notch analysis system 150. The user may view all or any subset of information determined by this algorithm.

The notch evaluation module 158 categorizes the notch based on a comparison with prior detected notches in the library. Details of an algorithm for categorizing notch events are discussed in more detail in connection with FIG. 6 below. Information for a notch may be used to provide a general determination of the source of the notch. An algorithm for determining the source of the notch which may be carried out by the notch evaluation module 158 is discussed in more detail in connection with FIG. 7 below.

Mitigation of recurring notch events may be performed by requesting possible mitigation techniques based on the determination of mitigation devices such as filters, isolation transformers or chokes as is discussed in more detail in connection with FIG. 8A below. The notch mitigation analysis module 160 may automatically determine whether a mitigation device was installed. Alternately, the end-user may manually indicate that a mitigation device was installed. If the mitigation device was installed, the notch mitigation analysis module 160 may provide the user with information on the effectiveness of the mitigation device as is discussed in more detail in connection with FIG. 8B below. Another mitigation recommendation includes suggesting changes to the system's operational parameters, such as operating one drive slower or faster than other drives. When this mitigation recommendation is followed, notching (e.g., its severity or frequency of occurrence) may be mitigated.

The user is provided with information on the effects of the mitigation device that was installed according to user-defined, default, or predefined configuration information for reporting and according to the criteria to be used for such reporting. All relevant data concerning the mitigation device, its ameliorative effects on the occurrence of subsequent notches, if any, and updates to a historical information database may be stored on the memory device 152.

Figure 6:
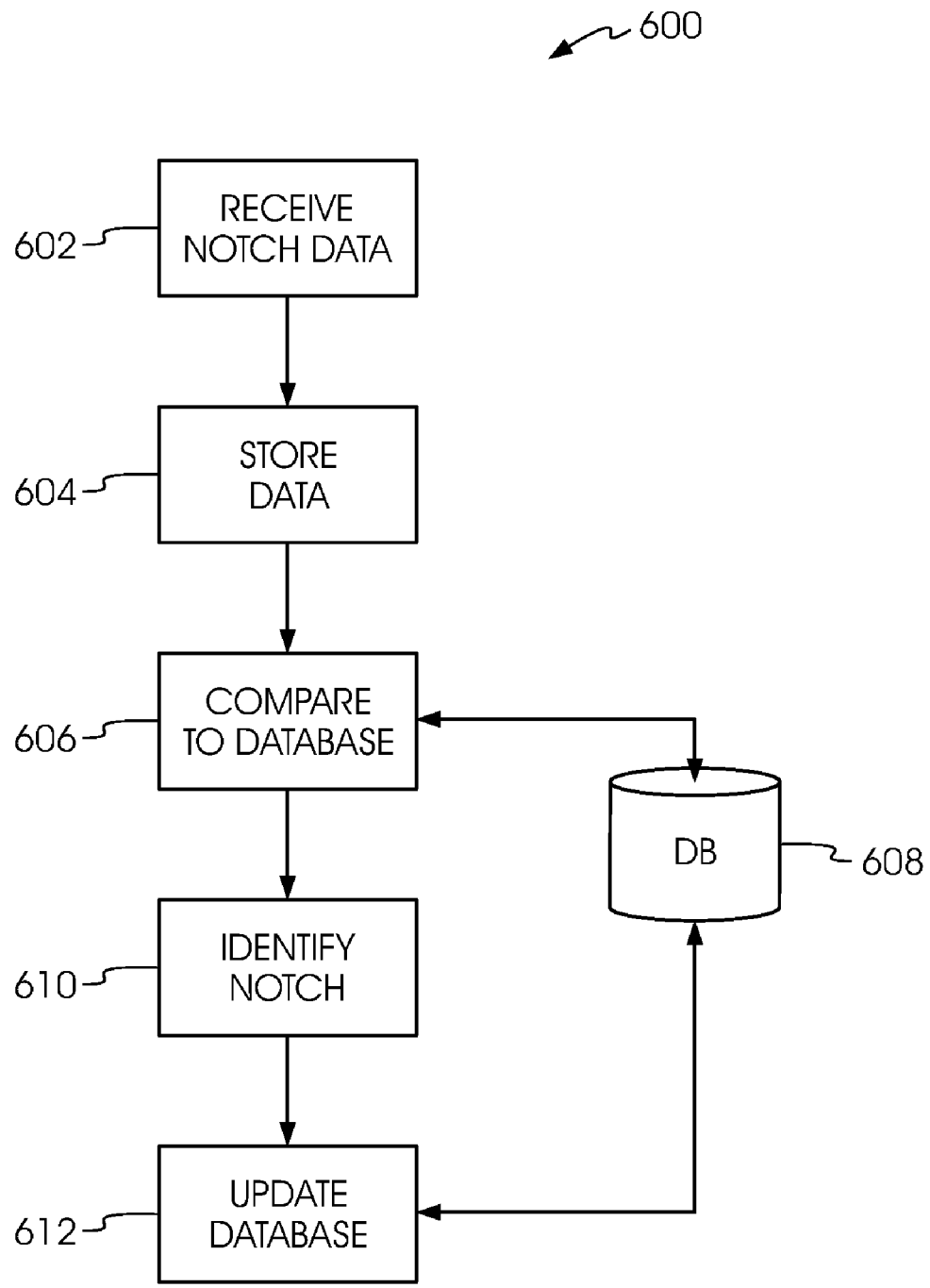
FIG. 6 is a flow diagram of a process for categorizing a detected notch.

FIG. 6 illustrates a flow chart of a notch-event categorization algorithm 600, which is stored in the notch evaluation module 158 of the notch analysis system 150 in this example.

If a notch event is detected by the monitoring device 102, the notch characteristic information is determined as explained above and sent to the algorithm 600 (602). The information associated with the notch (e.g., depth, phase, duration and zero-crossing) determined by the monitoring device 102 is used to derive additional data associated with the notch as explained above. Notch data is stored in the memory device 110 of the monitoring device 102 and/or the memory device 152 in the notch analysis system 150 (604). The algorithm 600 compares the data relating to the current notch with historical data relating to different categories of notches (606). This comparison may be carried out via statistical techniques such as correlations, data distributions, standard deviations, and the like. The historical data may be stored in a database 608, which is accessible to the algorithm 600. One method of comparison may rely upon a matrix of data types relating to notches. Such a matrix may be user-defined or may be a default matrix. As notch events occur, the notch analysis system 150 builds a database of such notch data, which enhances its ability to identify and categorize future notches that resemble or are identical to historical notches observed by the notch analysis system 150. The notch event is categorized based on the comparison (610). The database 608 is updated with the data from the currently detected notch (612). Based on this information, the source of the notch can be identified or mitigation measures can be suggested, including identifying troublesome equipment that might be causing excessive notching or severe notching. These aspects are discussed in more detail in FIGS. 7-8 below.

Figure 7:
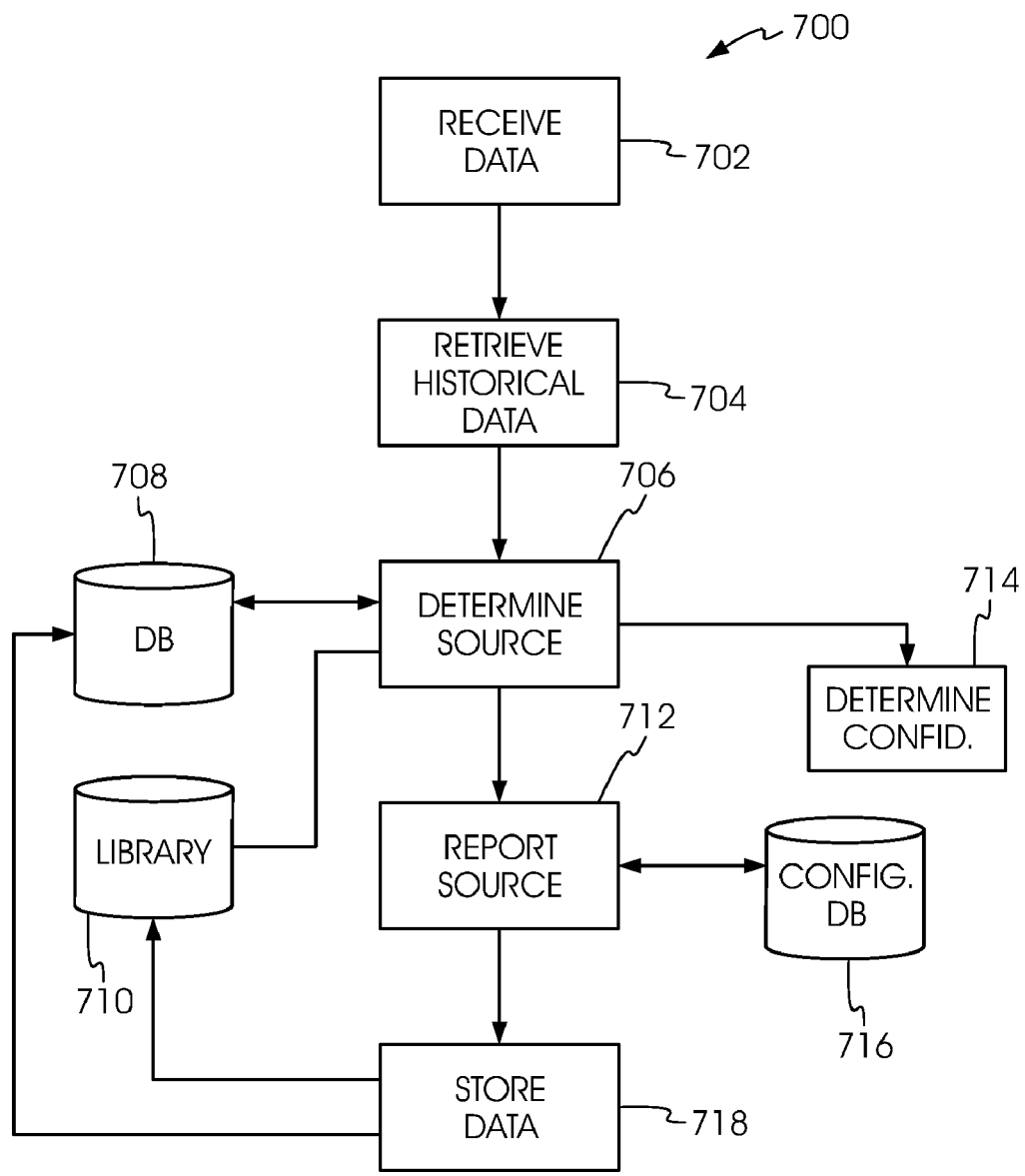
FIG. 7 is a flow diagram of a process for determining the source of a detected notch.

FIG. 7 illustrates a flow chart of an algorithm 700 that determines the source of a detected notch. This algorithm 700 is stored in the notch evaluation module 158 of the notch analysis system 150 in this example. The algorithm 700 first receives quantification data from the algorithm 500 in FIG. 5 and other analysis such as the notch characteristic information analysis from the algorithm 600 in FIG. 6 for a detected notching event (702). The user may be presented with an option to view information about a particular historical notch or notches in addition to the currently detected notch (704). The notch or notches selected by the user are evaluated and a notch source is determined against a list of known and expected characteristics of various sources of notches (706). Conventional statistical correlation, histogram, and simple comparison methods may be employed to determine which source type best correlates with the information from the selected notch or notches. For example, a user may request that the notch analysis system 150 determine the source of a notch that occurred recently. The user selects that notch, and the algorithm 700 determines, through statistical correlation, and the like, which source most likely corresponds to the selected notch based on factors such as occurrence time, duration, severity, phase, frequency, etc. The algorithm 700 draws upon a database 708 of stored historical information and a library 710 of known characteristics and/or expected characteristics for various notch sources. For example, if a particular notch pattern includes a notch that occurs twice per cycle, one having a positive polarity and the other having a negative polarity, then the source of the notch is likely a 6-pulse adjustable speed drive. Historical information concerning this notch pattern and the likely source as well as other similar historical information is stored in the database 708. The library 710 may be supplemented by user, manufacturer, or other database information containing notch source characteristics. A threshold confidence level can be programmed into the algorithm 700 or selected by the user to set the level of correlation desired. Once the source of the notch is determined, the source or probable source may be reported to the user (712).

In still another example, the user may request information about a range of historical notches (704), and the algorithm 700 determines whether a single source may be causing these notches. To do so, the algorithm 700 consults the stored historical information 710 and the library of known and/or expected notch source type characteristics, and through statistical correlation, histogram algorithms, simple comparisons, or the like, determines, to a certain degree of confidence, that the notches are or are not likely caused by a single source.

When a notch event is detected by a monitoring device 102, the algorithm 700 evaluates the data derived from the notch and determines, according to the methods described above, the source of the notch against a list of known and expected characteristics of various notch sources (706). For example, one source might be an adjustable speed drive, and known characteristics describing this source may be stored in the library 710. Additionally, expected characteristics of these notch sources may be stored in the library 710. Historical information concerning other notch events with other causes is stored in the database 708. When a notch is detected by the monitoring device 102, it is characterized and those characteristics are compared against the known and expected notch sources. When a strong correlation with a particular source is found such as a switching driver device, the algorithm 700 reports that the notch source is likely a switching driver (708). Optionally, the algorithm 700 can also report its confidence expressed, for example, as a numerical percentage of certainty, or as an expression of degree of certainty such as high or low confidence (714). The manner of reporting and criteria to be used in reporting the results to the user can be user-defined, default, or predefined in accordance with a reporting configuration database 716. The information as to the notch source is presented to the user according to the reporting configuration information stored in the database 716 or other data in memory.

The algorithm 700 stores the relevant data from the detected notch for reporting, analysis, and future reference (718). That data includes the characteristics associated with the notch, the source of the notch, the confidence level in the identification of the notch source, and any updates or changes to the database 708, library 710, or reporting configuration database 716.

Figure 8A:
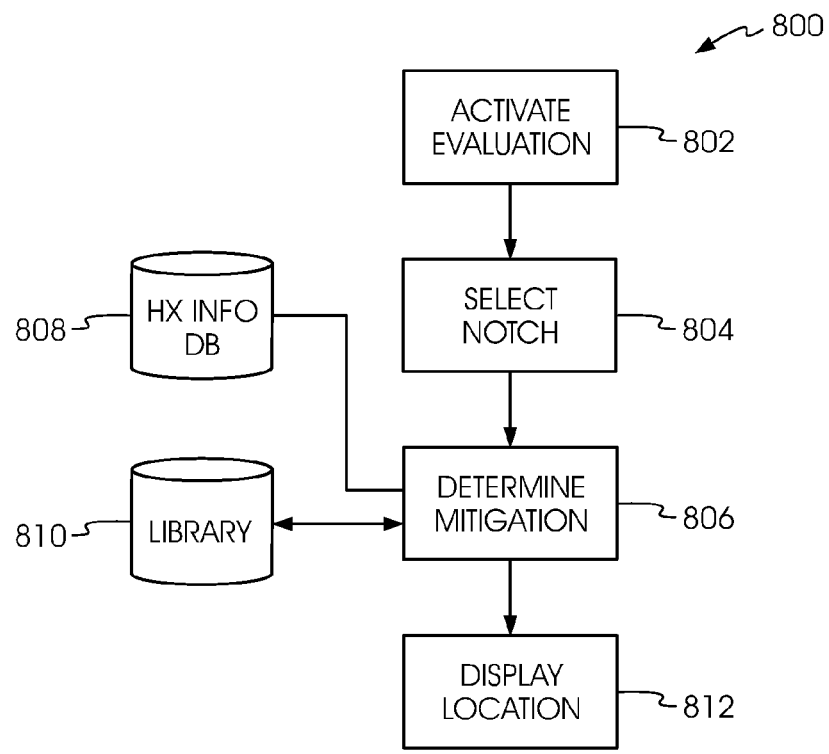
FIG. 8A is a flow chart diagram of a process for determining the best mitigation technique for suppressing or eliminating the effects of active or historical notches.

FIG. 8A is a flow chart of a mitigation determination algorithm 800 that determines the best mitigation technique for suppressing, reducing, or eliminating the effects of active or historical notches. This algorithm 800 may be stored in the mitigation analysis module 160 of the notch analysis system 150. The user indicates a desire for information on potential improvements by mitigation devices to activate the algorithm (802). The user selects a notch, multiple notches, or a particular notch source for application of mitigation devices (804). The notch may be a currently detected notch or one of a set of historically recorded notches. The algorithm 800 evaluates the characteristics of the notch or notches selected by the user from the data derived from the algorithm 500 in FIG. 5 and algorithm 600 in FIG. 6 to determine the best mitigation techniques to be implemented (806). To do so, the algorithm 800 draws upon stored historical information in a database 808 and a library 810 of mitigation techniques and applications for a given set of notch types or notch sources. This library 810 may be supplemented by user, manufacturer, or other database information containing mitigation techniques and applications. For example, for a selected combination of notch characteristics, the library 810 may suggest, based on the historical information database 808, that a filter be installed on or near a piece of equipment that is the likely source of a notch event. In other circumstances, the library 810 may suggest the application of an isolation transformer. Information like this is provided to the user according to user-defined, default, or predefined configuration information for reporting and according to the criteria to be used for such reporting. For example, when the hierarchical layout of the power system 100 is known, the user can be presented with a graphical layout of the power system 100, along with a graphical representation of the mitigation device over the location on the layout where it should be installed (812). The layout may also include a graphical representation of the equipment that is likely the source of the notch. The notch analysis system 150 can then determine how effective the mitigation device was and data representing its effectiveness or non-effectiveness may be stored to build up the historical database 808. This aspect is described in more detail in FIG. 8B.

If the monitoring device 102 detects a notching event (802), the algorithm 800 evaluates the characteristics of the notch event and determines the best mitigation technique(s) to be implemented (804). Here, the algorithm 800 draws upon the same database 810 and library 812 to correlate the data relating to the detected notch with known or historical data and the corresponding mitigation techniques that can effectively reduce or eliminate the effect of that particular notch source.

Figure 8B:
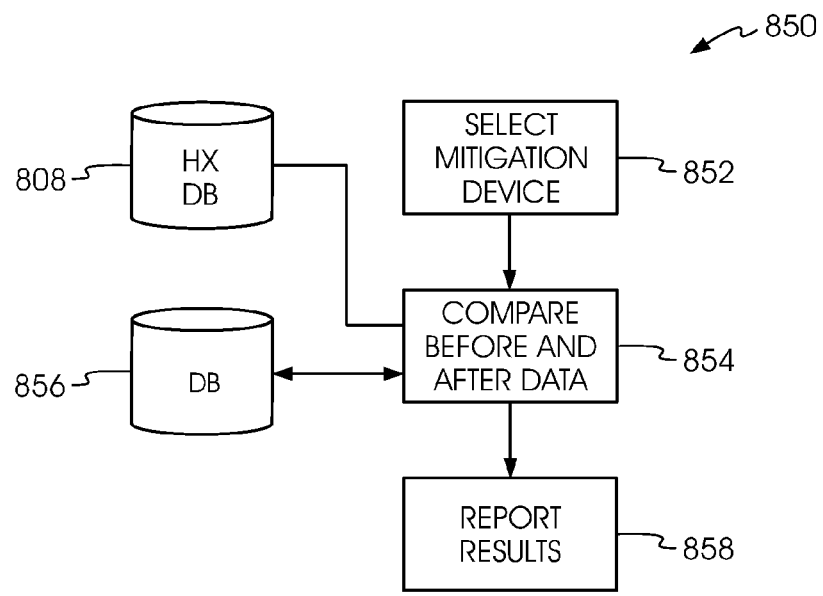
FIG. 8B is a flow chart diagram of a process for determining how effective a suggested installed mitigation device was on reducing or eliminating a notch.

FIG. 8B is a flow chart of a mitigation effectiveness algorithm 850 that determines how effective a suggested installed mitigation device was on reducing or eliminating the notching caused by a notching source. Like the algorithm 800, this algorithm 850 is stored in the mitigation analyzer module 160. The algorithm 850 first queries whether the user wants information on whether a particular mitigation device improved the system's response to a notch event (852). The algorithm 850 evaluates the history of a notch event to determine improvements to the power system 100 using statistical analysis, histograms, or simple comparison techniques (854). To do so, the algorithm 850 consults the database of 808 of stored historical information (concerning notch events and their corresponding characteristics) and a database 856 of customer-supplied information on the date of installation, type, location, and other pertinent information as required regarding the mitigation equipment that was installed. For example, the algorithm 850 makes a determination that a mitigation device caused an overall improvement when a comparison of the historical effects of a notch event are improved compared to those effects after the mitigation device was installed. A threshold can be set by the user or automatically set by the notch analysis system 150 to quantify the level of improvement necessary before an overall improvement is reported to the user. The resulting comparison is reported to a user (858). The form of the reporting may include a graphical or numerical analysis of the notch data before and after the mitigation device was installed. Additionally, a return on investment (ROI) for the mitigation device that was installed may be determined based upon the cost of the mitigation device, its date of installation, and the aggregate savings in downtime, capital expenses, and other expenses related to the non-mitigated system.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. In an electrical system, a method of detecting the occurrence of a notch event on any phase or phases, which lasts no longer than half of a cycle of an alternating-current waveform, comprising:
sampling a voltage waveform to produce a sampled voltage waveform;
providing a reference waveform based on an ideal voltage waveform;
determining a plurality of threshold voltages based on corresponding voltages of the reference waveform;
comparing the voltages of the sampled voltage waveform with the corresponding threshold voltages;
indicating the presence of a notch when a voltage of the sampled voltage waveform exceeds the corresponding threshold voltage; and
storing, on a storage device, at least one characteristic of the notch as notch characteristic information.

2. A computer readable medium encoded with instructions for directing a controller to perform the method of claim 1.

3. The method of claim 1, wherein the threshold voltages are a percentage of the corresponding voltages of the reference waveform.

4. The method of claim 1, wherein the threshold voltages are a fixed value function of the corresponding voltages of the reference waveform.

5. The method of claim 1, further comprising:
determining the shape of the notch event by storing the difference between the voltages of the reference waveform and the corresponding voltages of the sampled voltage waveform while the voltages of the sampled voltage waveform are at least greater in magnitude than the corresponding threshold voltages.

6. The method of claim 5, wherein the at least one characteristic corresponds to the shape of the notch event.

7. The method of claim 6, wherein the at least one characteristic is at least one of notch depth, phase angle at which the notch occurs, duration of the notch, or whether the notch event crosses the zero-axis.

8. The method of claim 6, further comprising storing notch characteristic information relating to previously detected notch events.

9. The method of claim 6, further comprising:
selecting a notch mitigation device based on the at least one characteristic relating to the notch event; and
installing the notch mitigation device in the electrical system.

10. The method of claim 9, further comprising evaluating the effectiveness of the notch mitigation device based on notch characteristic information relating to a subsequent notch event.

11. The method of claim 6, further comprising automatically determining the source of the notch event based on the notch characteristic information.

12. The method of claim 6, further comprising assigning the notch event to a predetermined category of notch events based on the notch characteristic information.

13. The method of claim 1, further comprising triggering an alarm when the notch event is detected.

14. A notch detection system to detect a notch event in an electrical system, comprising:
a monitoring device to sample a voltage waveform to produce a sampled voltage waveform; and a controller coupled to the monitoring device to:
provide a reference waveform based on an ideal voltage waveform,
determine a plurality of threshold voltages based on corresponding voltages of the reference waveform,
compare the voltages of the sampled voltage waveform with the corresponding threshold voltages and determine the presence of a notch when a voltage of the voltage waveform exceeds the corresponding threshold voltage, and
store at least one characteristic of the notch as notch characteristic information.

15. The system of claim 14, wherein the threshold voltages are a percentage of the corresponding voltages of the reference waveform.

16. The system of claim 14, wherein the threshold voltages are a fixed value function of the corresponding voltages of the reference waveform.

17. The system of claim 14, wherein the controller further:
determines the shape of the notch event by calculating the difference between the voltages of the reference waveform and the corresponding voltages of the sampled voltage waveform while the voltages of the sampled voltage waveform are greater in magnitude than the corresponding threshold voltages.

18. The system of claim 17 wherein the controller determines the shape of the notch based upon at least the notch characteristic information.

19. The system of claim 18, wherein the at least one characteristic is at least one of notch depth, phase angle at which the notch occurs, duration of the notch, or whether the notch event crosses the zero-axis.

20. The system of claim 18, further comprising a storage device coupled to the controller, the storage device storing the notch characteristic information relating to the detected notch.

21. The system of claim 18, further comprising a notch mitigation analysis module in communication with the controller, the notch mitigation analysis module automatically selecting a notch mitigation device based on the notch characteristic information relating to the notch event.

22. The system of claim 21, wherein the notch mitigation analysis module evaluates the effectiveness of a notch mitigation device based on notch characteristic information relating to a subsequent notch event.

23. The system of claim 18, further comprising a notch evaluation module that determines the source of the notch event based on the notch characteristic information.

24. The system of claim 18, further comprising a notch evaluation module that determines a category of the notch event based on the notch characteristic information.

25. The system of claim 14, further comprising a display to display the notch characteristic information relating to the notching event.

26. A power monitoring device for detecting a notch event that lasts no longer than half a cycle of an alternating-current waveform, the power monitoring device comprising:
a sensor to detect a voltage waveform of the alternating-current waveform;
a sampling circuit coupled to the sensor to produce a sampled voltage waveform from the voltage waveform; and
a controller determining a reference waveform, the controller determining a plurality of threshold voltages based on corresponding voltages of the sampled reference waveform and comparing the voltages of the sampled voltage waveform with the corresponding threshold voltages and indicating the presence of a notch when a voltage of the sampled voltage waveform exceeds the corresponding threshold voltage, the controller further determining at least one characteristic of the notch, the at least one characteristic being notch depth, phase angle at which the notch occurs, duration of the notch, or whether the notch event crosses the zero-axis; and
a display for displaying information indicative of the at least one characteristic.

27. The monitoring device of claim 26, wherein the controller further:
determines the shape of the notch event by calculating the difference between the voltages of the reference waveform and the corresponding voltages of the sampled voltage waveform while the voltages of the sampled voltage waveform are greater in magnitude than the corresponding threshold voltages.

28. The monitoring device of claim 27, further comprising a storage device storing information indicative of the shape of the notch event.

29. The monitoring device of claim 28, further comprising a communications interface to transmit the notch characteristic information relating to the notch event.

30. The monitoring device of claim 26, further comprising an alarm coupled to the controller, the controller triggering the alarm when a notch event is detected.

* * * * *